United States Patent [19]

Inagaki et al.

[11] Patent Number: 4,688,196

[45] Date of Patent: Aug. 18, 1987

[54] SEMICONDUCTOR DYNAMIC MEMORY DEVICE WITH LESS POWER CONSUMPTION IN INTERNAL REFRESH MODE

[75] Inventors: Yasaburo Inagaki; Kazuo Nakaizumi, both of Tokyo, Japan

[73] Assignee: NEC Corporation, Tokyo, Japan

[21] Appl. No.: 647,573

[22] Filed: Sep. 6, 1984

[30] Foreign Application Priority Data

Sep. 6, 1983 [JP] Japan ................................. 58-163457

[51] Int. Cl.[4] .............................................. G11C 7/00
[52] U.S. Cl. .................................... 365/222; 365/227
[58] Field of Search ............... 365/222, 189, 227, 230, 365/226

[56] References Cited

U.S. PATENT DOCUMENTS 4,005,395  1/1977  Fosler, Jr. et al. .................. 365/227

FOREIGN PATENT DOCUMENTS

| 1171526 | 7/1984 | Canada. | |
| 0031672 | 7/1981 | European Pat. Off. | ............ 365/227 |
| 2111777 | 7/1983 | United Kingdom | ................ 365/222 |
| 2116338 | 9/1983 | United Kingdom. | |

Primary Examiner—James W. Moffitt
Assistant Examiner—Glenn A. Gossage
Attorney, Agent, or Firm—Sughrue, Mion, Zinn, Macpeak & Seas

[57] ABSTRACT

The semiconductor memory device includes an internal refresh circuit and an input circuit composed of first and second transistors of a different conductivity type having gates connected in common to an external control signal input terminal and connected in series with each other. A third transistor is connected in series to the first and second transistors. The third transistor is deactivated when the internal refresh circuit, operates to carry out a self-refresh mode, thereby suppressing a power consumption in the input circuit.

14 Claims, 4 Drawing Figures

SEMICONDUCTOR DYNAMIC MEMORY DEVICE WITH LESS POWER CONSUMPTION IN INTERNAL REFRESH MODE

BACKGROUND OF THE INVENTION

This invention relates to a semiconductor dynamic memory device, and more particularly to an input stage receiving an external control signal to a semiconductor memory device having an internal refresh circuit.

A semiconductor dynamic memory device equipped with so-called "one-transistor dynamic memory cells" arrayed in matrix is widely used at present. The one-transistor dynamic memory cell consists of one insulated gate field effect transistor (IGFET) such as a MOS (Metal-Oxide-Semiconductor) transistor and one storage capacitor and is very simple in circuit configuration and device structure. Accordingly, a great number of memory cells is formed in a high integration, and thus a device having a large memory capacity is obtainable at a low cost. However, the data voltage stored in each memory cell is lowered due to the leakage current of the storage capacitor, and hence each row line (word line) of a memory cell array should be accessed periodically to restore the data in the memory cell. That is, a refresh operation is required.

The refresh operation may be effected by control signals externally supplied to the memory device. In the so-called "multi-address input type memory device" in which row and column address signals are supplied to the same address input terminals in synchronism with row and column address strobe ($\overline{RAS}$ and $\overline{CAS}$) signals, each row line is selected in sequence by increasing (or decreasing) the content of the row address signals one by one in synchronism with the $\overline{RAS}$ signals, so that the memory cells connected to the selected row line are refreshed. Such a refresh operation is called as a "$\overline{RAS}$ only refresh". However, since the row address signals are externally supplied to the memory device in synchronism with the $\overline{RAS}$ signal, an external control signal timing circuit becomes complicated.

In order to remove such a defect, a dynamic memory device provided with an internal refresh circuit has been developed. The internal refresh circuit carries out the refresh operation automatically at the time of a standby or the like. Such a memory device is often called as a "pseud-static memory device" and is widely employed.

The internal refresh circuit has a refresh timing circuit, an internal address counter and a timer circuit, and is controlled by a refresh signal supplied to a refresh ($\overline{RFSH}$) terminal. An internal refresh mode is classified into a pulse-refresh mode and a self-refresh mode. When the refresh signal takes a refresh-enable level, the content of the internal address counter is supplied to a row decoder as a row address, so that one row line is selected by the row decoder to refresh the memory cells coupled to the selected row line. The content of the internal address counter is then increased (or decreased) by one. At this time, if the refresh signal is turned to a refresh-disenable level, the subsequent refresh operation is not be carried out. When the refresh signal takes the refresh-enable level again, the increased (or decreased) content of the internal address counter is supplied to the row decoder as a new row address, so that memory cells connected to the next row line are refreshed. The content of the internal refresh counter is then further increased (decreased) by one. Thus, the internal refresh operation is carried out every time the refresh signal takes the refresh-enable level. This is the pulse-refresh mode.

On the other hand, if the refresh signal is retained at the refresh-enable level, the timer circuit operates to generate a refresh request signal at every predetermined cycle periods. In response to the refresh request signal, the refresh timing circuit supplies the content of the internal address counter to the row decoder as a row address to refresh the memory cells, and the content of the internal address counter is then incremented (decremented) by one. As long as the refresh signal is retained at the refresh-enable level, the refresh request signal is generated, so that the row line is selected one by one to perform the refresh operation. This is the self-refresh mode.

A power consumption at a time when the internal refresh operation is carried out depends on the power consumed at an input stage connected to an input terminal ($\overline{RAS}$ terminal, for example) supplied with the external control signal, other than a current required for the refresh of the memory cells. A complementary MOS integrated circuit having P-channel and N-channel MOS transistors works on a low consumption power, and hence is employed in the memory device. A memory device using the complementary MOS structure has a complementary MOS inverter as the input stage for the purpose of the waveform-shaping of the external control signal. The complementary MOS inverter includes P-channel and N-channel MOS transistors connected in series between power supply terminals, and the gates thereof are connected in common to a signal input terminal, a signal supplied to an internal circuit being derived from the node thereof. When the input signal is in high a level, the N-channel MOS transistor is turned on, and the P-channel MOS transistor is cut off. When the input signal takes a low level, on the contrary, the P-channel MOS transistor is turned on, and the N-channel MOS transistor is turned off. Accordingly, the d.c. current flowing between the power supply terminals is slightly generated only when the conductive states of N-channel and P-channel MOS transistors are switched over, and hence a consumption power is satisfactorily small.

Particularly in the self refresh mode of the memory device, the row address strobe signal supplied to the $\overline{RAS}$ terminal is retained at an inactive level to prevent the external address signals from being supplied to the address input terminals. Consequently, each gate of the P-channel and N-channel MOS transistors in the input stage provided for the $\overline{RAS}$ terminal is subjected to the inactive level of the row address strobe signal throughout the self-refresh mode. If the inactive level is effective enough to turn either one of the P-channel and N-channel MOS transistors off, the power consumption in the input stage will scarcely occur. The external control signals are often generated through the TTL (Transistor-Transistor Logic) circuit to drive a plurality of memory devices. In such a case, the external control signals take an inactive level in the TTL level, so that such a level will turn both P-channel and N-channel MOS transistors on. Consequently, a d.c. current flows in the input stage during the period of the self-refresh mode, resulting in increase in the power consumption of the memory device.

Further, the row address strobe signal should be retained at the inactive level during the period of the self-refresh mode, and therefore the simplification of the external timing circuit cannot be satisfactory.

SUMMARY OF THE INVENTION

An object of the present invention, therefore, is to provide a semiconductor memory device with an internal refresh circuit having an improved signal input stage.

Another object of the present invention is to provide a semiconductor memory device having an internal refresh circuit in which the power consumption is reduced in an internal refresh mode.

A further object of the present invention is to provide a semiconductor memory device wherein a row address strobe signal can take any logic levels in a self-refresh mode.

A semiconductor memory device according to the present invention comprises a memory cell array having a plurality of memory cells arrayed in matrix, an internal refresh circuit for refreshing at least one of the memory cells, a signal input terminal receiving a control signal used for controlling a data write and/or read operation of a selected memory cell, an input circuit including first and second transistors each having a gate connected to the signal input terminal and connected in series with each other, a third transistor connected in series to the first and second transistors, and a control circuit inactivating the third transistor when the internal refresh circuit operates.

The internal refresh circuit does not operate at the time of the memory operation, and therefore the third transistor is in an activated condition. Consequently, the control signal is supplied through the signal input terminal to the input circuit having the first and second transistors, so that a data is written in or read out of the selected memory cell. When the internal refresh circuit operates to perform, particularly, a self refresh mode, the third transistor is inactivated by the control circuit. Since the third transistor is connected in series to the first and second transistors, a d.c. current which would otherwise flows through the first and second transistors is cut by the third transistor. As a result, the power consumption in the self refresh mode is suppressed.

It is favorable that a holding circuit is provided for retaining an output level of the input circuit when the third transistor is inactivated. Since the output level of the input circuit is held, the control signal supplied to the signal input terminal can take any one of high and low levels, and thereby a degree of design freedom of the external control circuit will be increased.

BRIEF DESCRIPTION OF THE DRAWINGS

The above-mentioned and other objects, features and advantages of the present invention will be made more clear from the following description taken in conjunction with the accompanying drawings, wherein.

DETAILED DESCRIPTION OF THE PREFERRED EMBODIMENT

Figure 1:
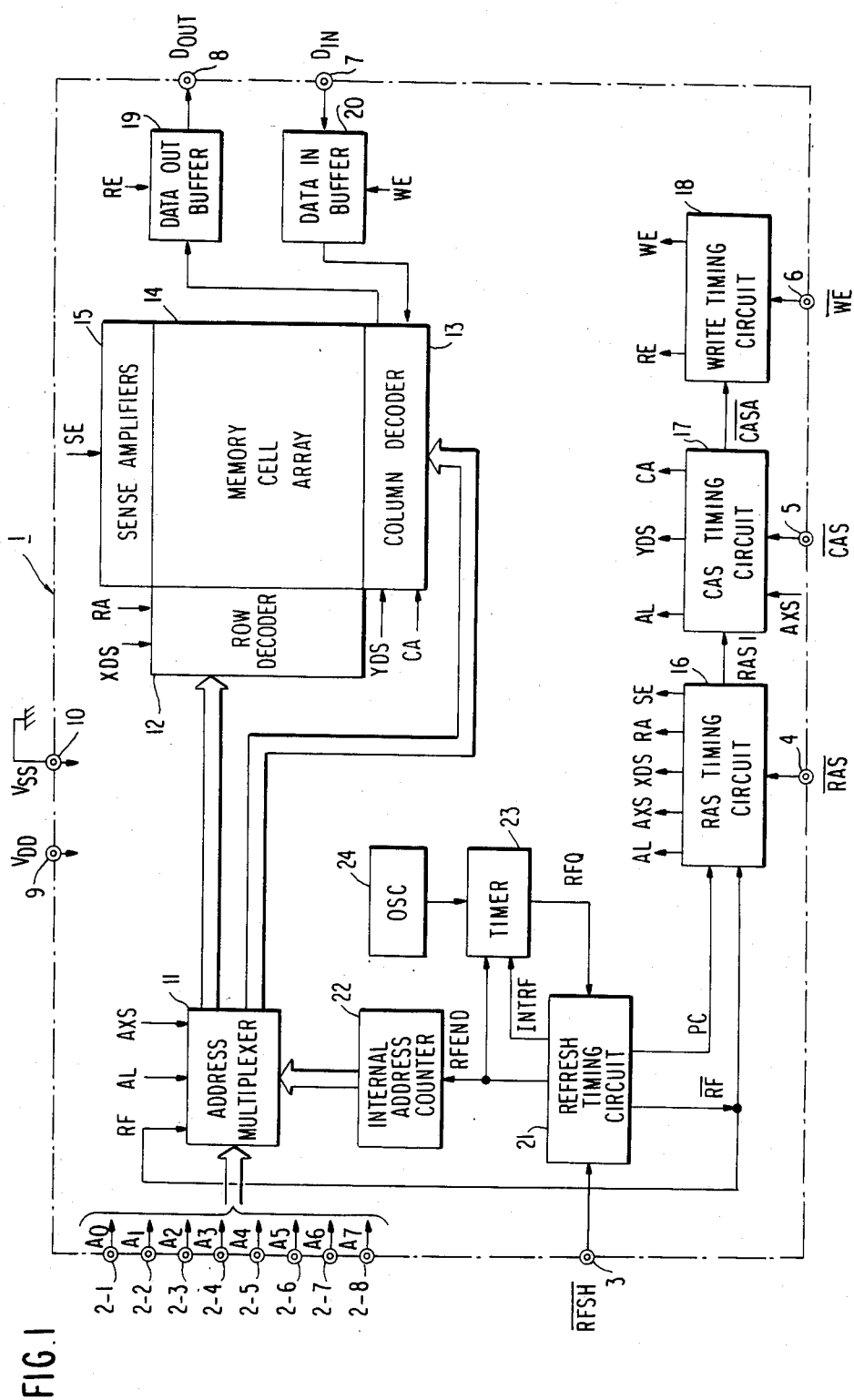
FIG. 1 is a block diagram of a memory device according to one embodiment of the present invention.

Referring now to FIG. 1, there is shown a memory device according to one preferred embodiment of this invention. This memory device is constituted as an integrated circuit device 1 which has a plurality (eight in this embodiment) of address input terminals 2-1 to 2-8, a refresh ($\overline{RFSH}$) terminal 3, a row address strobe ($\overline{RAS}$) terminal 4, a column address strobe ($\overline{CAS}$) terminal 5, a write enable ($\overline{WE}$) terminal 6, a data input ($D_{IN}$) terminal 7, a data output ($D_{OUT}$) terminal 8, a first power terminal ($V_{DD}$) 9 to which a positive voltage is supplied, and a second power terminal ($V_{SS}$) 10 receiving a ground potential. The configuration of the memory device will be described along with the data read and write operations and the pulse- and self-refresh operations.

The data read or write operation is started by changing a row address strobe signal supplied to the $\overline{RAS}$ terminal 4 from high to low level. A RAS timing circuit 16 generates an address latch signal AL of one-shot pulse form in response to the low-level row address strobe signal. The signal AL is supplied to an address multiplexer 11, and thus address signal supplied to the address terminals 2-1 to 2-8 are latched as a row address. A signal AXS generated from RAS timing circuit 16 is used for latching the address signals as a row address into flip-flop circuits (not shown) provided in the address multiplexer 11, and is turned to an inactive level in response to the fact that the address signals have been latched. The latched row address signals are supplied to a row decoder 12. The RAS timing circuit 16 then generates two signals XDS and RA for activating the row decoder 12. The row decoder 12 is activated in response to the signals XDS and RA and selects one row line (i.e., word line) in a memory cell array 14 in response to the address signals. The memory cell array 14 includes a plurality of row lines and column lines and further has a plurality of memory cells connected to the intersections of the respective row and column lines. Each of memory cells consists of one transistor and one storage capacitor. Accordingly, data of all the memory cells connected to the selected word line are read out on a plurality of column lines (i.e., digit lines). A RAS timing circuit 16 further generates a sense-enable signal SE for activating a sense amplifiers 15. In response to the signal SE, the sense amplifier 15 amplifies the data read out on the respective digit lines and restores the same data into the memory cells connected to the selected word line.

The RAS timing circuit 16 further supplies a signal RAS1 to CAS timing circuit 17. The CAS timing circuit 17 also receives the signal AXS from RAS timing circuit 16. When the row address strobe signal takes to a low level, the signals RAS1 and AXS are changed to the active level and inactive level, respectively, by which the CAS timing circuit 17 is brought into an operable state. In such a state, when a column address strobe signal to the $\overline{CAS}$ terminal 5 is changed to a low level, the CAS timing circuit 17 generates the signal AL. In response to the signal AL, the address multiplexer 11 introduces the address signals supplied to the address input terminals 2-1 to 2-8 as a column address and supplies them to a column decoder 13. At this time, the signal AXS holds an inactive level, the flip-flop circuits in the address multiplexer 11 continue to latch the row address signals. The CAS timing circuit 17 then generates signals YDS and CA for activating the column decoder 13. In response to the signals YDS and CA, the column decoder 13 selects one column line (digit line) corresponding to the supplied column address signals. Consequently, one memory cell is designated, which is disposed at an intersection of the word line selected by the row decoder 12 and the digit line selected by the column decoder 13. The CAS timing circuit 17 further generates a signal $\overline{CASA}$ for activating a write timing circuit 18.

The write enable signal supplied to the $\overline{WE}$ terminal 6 controls whether the data is read out of the designated memory cell or written in that cell. When the write timing circuit 18 is in an operable condition and when the write enable signal takes a high level, the circuit 18 makes a read-enable signal RE an active level and the write enable signal WE an inactive level. A data OUT buffer 19 is activated and a data IN buffer 20 is inactivated. Consequently, the data stored in the specified memory cell is outputted from the $D_{OUT}$ terminal 8. On the other hand, when the $\overline{WE}$ terminal 6 is kept at a low level, a data supplied to $D_{IN}$ terminal 7 is written in the specified memory cell through the data IN buffer 20.

The internal refresh circuit is activated by changing the $\overline{RFSH}$ terminal 3 to a low level when the $\overline{RAS}$ terminal 4 is kept at high level. More specifically, when the refresh signal supplied to the $\overline{RFSH}$ terminal 3 takes a low level, a refresh timing circuit 21 generates an internal refresh signal $\overline{RF}$. The signal $\overline{RF}$ is supplied to the address multiplexer 11 and RAS timing circuit 16. In response to the signal RF, the address multiplexer 11 transfers its input ends from the address input terminals 2-1 to 2-8 to an internal refresh counter 22. Further, the signal AXS is held to an active level. Consequently, the content of the internal refresh counter 22 is latched on the flip-flop circuits in the address multiplexer 11 and supplied to the row decoder 12 as a row address, and is also supplied to the column decoder 13 as a column address. In response to the signal $\overline{RF}$, RAS timing circuit 16 generates the signals XDS and RA for activating the row decoder 12 and further holds the signal RAS1 supplied to the CAS timing circuit 17 at an active level. It is to be noted that CAS timing circuit 17 is ready for operation when the signals RAS1 and AXS are kept at the active level and inactive level, respectively. The signal AXS is kept at active level by the signal $\overline{RF}$. Accordingly, CAS timing circuit 17 is inactivated, and hence signals YDS, CA and $\overline{CASA}$ are not generated. Consequently, the column decoder 13 is is inactivated. The write timing circuit 18 is also inactivated. Since the row decoder 12 is activated by the signals XDS and RA, one word line (row line) is selected in accordance with the content of the internal address counter 22. RAS timing circuit 16 then generates the sense enable signal SE, so that the data of the memory cells connected to the selected word line are read. The read out data are amplified by the sense amplifiers 15, and the same data are restored. That is, the refresh operation is carried out. Upon completion of the refresh operation, the refresh timing circuit 21 generates a refresh end signal RFEND and inactivates the internal refresh signal $\overline{RF}$. The signal RFEND is supplied to the internal address counter 22 to increase the content thereof by one. If desired, it may be decreased by one. The signal RFEND is supplied to a timer circuit 23 as a timer start signal. A signal INTRF from the refresh timing circuit 21 is supplied to the timer circuit 23 for controlling its operation. The signal INTRF is generated when the $\overline{RFSH}$ terminal 3 is kept at a low level. When the terminal 3 is changed to a high level, the signal INTRF is inactivated. Accordingly, when $\overline{RFSH}$ terminal 3 is inverted from low to high, the signal INTRF is not generated, so that the timer circuit 23 does not operate. Consequently, a refresh request signal RFQ is not generated, and the internal refresh circuit stops the operation after refreshing the memory cells connected to the one word line. When $\overline{RFSH}$ terminal 21 is inverted again into the low level, the increased (or decreased) content of the internal address counter 22 is supplied again to the row decoder as a row address. Accordingly, the word line subsequent or precedent to the word line selected previously is selected to refresh the memory cells connected to the selected word line. As described above, the selected word line is shifted in sequence at each time when the terminal 3 is changed to the low level, whereby the pulse-refresh operation is carried out.

When the $\overline{RFSH}$ terminal 3 is maintained to the low level, the circuit 21 continues to supply the signal INTRF to the timer circuit 23. Consequently, the timer circuit 23 starts the timer operation in response to the signal RFEND, and by using an output from an oscillator 24, the refresh request signal RFQ is generated after a predetermined time elapses. The oscillator 24 generates an oscillation signal to produce a predetermined bias voltage supplied to a substrate (not shown) of the integrated circuit device 1. In response to the signal RFQ, the refresh timing circuit 21 generates the signal $\overline{RF}$ again, so that the content of the counter 22 is supplied to the row decoder 12. After the memory cells coupled to the selected word line are refreshed as described above, the signal RFEND is generated. Consequently, the content of the counter 22 is further increased (or decreased) by one, and the timer circuit 23 starts the timer operation. According to the refresh request signal RFQ, the further increased content of the internal address counter 22 is supplied to the row decoder 12 to preform the refresh operation. As long as the $\overline{RFSH}$ terminal 3 is kept at a low level, the refresh operation is carried out. That is, the memory device is brought into the self-refresh mode.

In response to the refresh request signal RFQ from the timer circuit 23, the refresh timing circuit 21 further generates a power control signal PC. The power control signal PC is supplied to a signal input stage of the RAS timing circuit 16. As a result, a d.c. current is prevented from flowing through the signal input stage of the RAS timing circuit 16, so that a power consumption therein is almost zero. Furthermore, it becomes unnecessary to keep the $\overline{RAS}$ terminal 4 at a high level.

Figure 2:
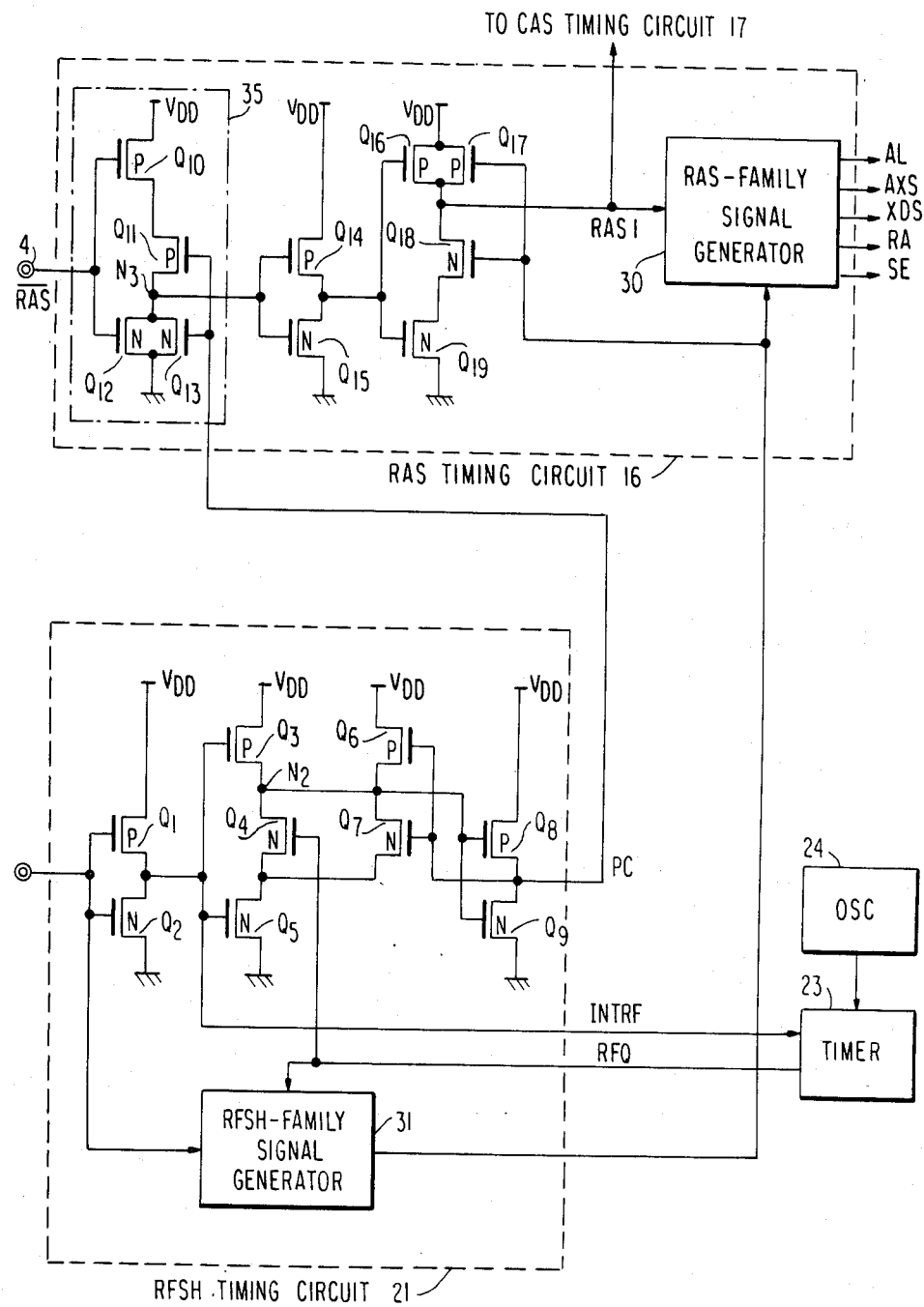
FIG. 2 is a circuit diagram representing a part of FIG. 1.

The detailed description will be made with reference to FIG. 2 which shows the circuit diagram of a part of the refresh timing circuit 21 and the input stage of the RAS timing circuit 16. As will be apparent from FIG. 2, each circuit block shown in FIG. 1 is constituted of complementary MOS transistors having P- and N-channel MOS transistors.

$\overline{RAS}$ terminal 4 is connected to the gates of a P-channel MOS transistor $Q_{10}$ and an N-channel MOS transistor $Q_{12}$. The transistors $Q_{10}$ and $Q_{12}$ are connected in series between power supply terminals ($V_{DD}$ and GND), but a P-channel MOS transistor $Q_{11}$ is inserted between the transistors $Q_{10}$ and $Q_{12}$. An N-channel MOS transistor $Q_{13}$ is connected in parallel with the transistor $Q_{12}$. The signal PC generated from the refresh timing circuit 21 is supplied to the gates of the transistors $Q_{11}$ and $Q_{13}$. Accordingly, the transistors $Q_{10}$ to $Q_{13}$ constitute a two-input NOR circuit 35 having two input ends supplied with the signal PC and the row address strobe signal, and its output appears on a node $N_3$. The output at the node $N_3$ is supplied to the gates of P- and N-channel MOS transistors $Q_{16}$ and $Q_{19}$ through a complementary inverter consisting of P- and N-channel MOS transistors $Q_{14}$ and $Q_{15}$. An N-channel MOS transistor $Q_{18}$ is connected between the transistors $Q_{16}$ and $Q_{19}$. A P-channel MOS transistor $Q_{17}$ is connected in parallel with the transistor $Q_{16}$. The signal $\overline{RF}$ from the refresh timing circuit 21 is supplied to the gates of the transistors $Q_{17}$ and $Q_{18}$. The signal RAS1 for activating CAS timing circuit 17 is derived from the junction point of the transistors $Q_{16}$ and $Q_{18}$. The signal RAS1 is supplied to a RAS-family signal generator 30, and thus the signals AL, AXS, XDS, PA and SE described in FIG. 1 are generated. The generator 30 also receives the signal $\overline{RF}$.

The signals $\overline{RF}$ and PC are kept at high and low levels, respectively, as described hereinafter, in the memory operation (that is, data write or data read operation). Accordingly, the transistors $Q_{11}$ and $Q_{18}$ are made conductive, and the transistors $Q_{13}$ and $Q_{17}$ are made nonconductive. When the $\overline{RAS}$ terminal 4 is inverted from a high level to a low level for introducing external address signals, the transistors $Q_{10}$ and $Q_{12}$ are turned on and off, respectively, and the node $N_3$ takes a high level. Accordingly, the transistors $Q_{15}$ and $Q_{16}$ are turned on, and the transistors $Q_{14}$ and $Q_{19}$ are turned off. The signal RAS1 holds a high level. The CAS timing circuit 17 is activated by the high-level signal RAS1 to respond to the column address strobe signal supplied to the $\overline{CAS}$ terminal 5, and further the RAS-family signal generator 30 changes the signals AL, AXS, XDS, RA, and SE at a level necessary for memory operation in a predetermined timing relationship.

$\overline{RFSH}$ terminal 3 is connected to the gates of P- and N-channel MOS transistors $Q_1$ and $Q_2$. The signal INTRF is derived from a node $N_1$ between the transistors $Q_1$ and $Q_2$ and is supplied to the timer circuit 23. The signal INTRF is further supplied to the gates of P- and N-channel MOS transistors $Q_3$ and $Q_5$. An N-channel MOS transistor $Q_4$ is connected between the transistors $Q_3$ and $Q_5$. The transistor $Q_4$ receives at its gate the refresh request signal RFQ from the timer circuit 23. The $\overline{RFSH}$ terminal 3 is further connected to a RFSH-family signal generator 31. In response to the low level of the $\overline{RFSH}$ terminal 3, the generator 31 generates the signal RFEND supplied to the timer circuit 23 and the signal RF supplied to RAS timing circuit 16. The generator 31 also receives the signal RFQ from the timer circuit 23.

A node $N_2$ between the transistors $Q_2$ and $Q_4$ is connected to the gates of P- and N-channel MOS transistors $Q_8$ and $Q_9$ connected in series between power supply terminals, and the signal PC is generated from the node thereof and supplied to the input stage of the RAS timing circuit 16. The signal PC is further supplied to the gates of P- and N-channel MOS transistors $Q_6$ and $Q_7$. The transistor $Q_6$ is connected between the node $N_2$ and the terminal $V_{DD}$, and the transistor $Q_7$ is connected between the node $N_2$ and the junction point between the transistors $Q_4$ and $Q_5$.

In the memory operation, the $\overline{RFSH}$ terminal 3 is kept at a high level. Therefore, the transistor $Q_2$ is made conductive, so that the signal INTRF from the node $N_1$ holds a low level. The timer circuit 23 is inactivated.

The transistor $Q_3$ is turned on in response to the low-level signal INTRF, so that the transistor $Q_9$ is also turned on. Consequently, the signal PC holds a low level. The high level of the $\overline{RFSH}$ terminal 3 operates on RFSH-family signal generator 31 to generate a high-level signal $\overline{RF}$.

A circuit operation in the internal refresh mode will be described with reference to FIG. 3. In this mode, the row address strobe signal supplied to $\overline{RAS}$ terminal 4 is inverted to high level. Accordingly, the transistors $Q_{12}$, $Q_{14}$ and $Q_{19}$ are turned on, and the signal RAS1 holds a low level. Since a refresh signal to $\overline{RFSH}$ terminal 3 is inverted to a low level at a time $T_1$, RFSH-family signal generator 31 inverts the signal $\overline{RF}$ from high to low level at a time $T_2$. Consequently, the transistor $Q_{17}$ is turned on, whereas the transistor $Q_{18}$ is turned off, so that the signal RAS1 is inverted to a high level. The signal $\overline{RF}$ having a low level is further supplied to the RAS-family signal generator 30. In response to the signals RAS1 and $\overline{RF}$ which are respectively inverted to high and low, RAS-family signal generator 30 turns the signals XDS, RA and SE to an active level, as described in FIG. 1, at a predetermined timing. Consequently, one row line is selected in accordance with the content of the internal address counter 22, and the memory cells connected to the selected row line are refreshed.

When the $\overline{RFSH}$ terminal 3 is inverted from high to low level, the transistor $Q_1$ is turned on, and the transistor $Q_2$ is turned off. Accordingly, the transistors $Q_3$ and $Q_5$ are made nonconductive and conductive, respectively. At this time, the transistor $Q_4$ is maintained in a nonconductive state, since the timer circuit 23 does not generate the refresh request signal RFQ. Further, the transistor $Q_6$ is made conductive. Therefore, the potential at the node $N_2$ is held at a high level, and the signal PC is held at a low level.

Since the signal INTRF is changed to a high level, the timer circuit 23 is activated and starts the timer operation in response to the refresh end signal RFEND. However, in the case of the pulse-refresh mode, the signal INTRF is inverted to a low level, and hence the timer circuit 23 is inactivated.

When the $\overline{RFSH}$ terminal 3 is retained at a low level to perform the self-refresh mode, the timer circuit 23 starts the timer operation in response to the refresh end signal RFEND which is generated at a time $T_3$ and generates the refresh request signal RFQ at a time $T_4$. Consequently, the transistor $Q_4$ is turned on. Since the transistor $Q_5$ is kept on, the potential at the node $N_2$ is inverted to the low level. As a result, the transistors $Q_8$ and $Q_9$ are made conductive and nonconductive, respectively, and the power control signal PC is inverted to the high level at a time $T_5$.

In response to the high-level signal PC, the transistor $Q_{11}$ is made nonconductive. Accordingly, a d.c. current passage throught the transistors $Q_{10}$ and $Q_{12}$ is cut, and thus a power consumption comes zero. The transistor $Q_{13}$ is turned on in response to the signal PC, and therefore the potential at the node $N_3$ is changed to the low level. In this case, the transistors $Q_{11}$ and $Q_{13}$ are driven by the signal PC from the transistors $Q_8$ and $Q_9$ which constitute the complementary MOS inverter. That is, the signal PC takes a high level of the CMOS level. Consequently, the transistors $Q_{11}$ and $Q_{13}$ are accurately turned off and on, respectively. The low-level potential at the node $N_3$ is also CMOS level, and therefore the transistors $Q_{14}$ and $Q_{15}$ are also turned on and off accurately. Since the transistor $Q_{13}$ is turned on, the row address strobe signal supplied to $\overline{RAS}$ terminal 4 can take any one of the high and low level. Accordingly, the external timing control system can be designed with ease.

The refresh request signal RFQ is generated in pulse form, and therefore the transistor $Q_4$ is changed from on to off. However, since the transistor $Q_8$ is in a conductive state, the transistor $Q_7$ is turned on, whereas the transistor $Q_6$ is turned off. Therefore, the node $N_2$ is held at the low level, and the signal PC is retained at the high level.

The refresh request signal RFQ from the timer circuit 23 is also supplied to the RFSH-family signal generator 31, so that the signal $\overline{RF}$ is inverted to a low level at a time $T_6$. The signal RAS1 is inverted again to a high level, so that the next row line is selected in accordance with the increased content of the address counter 22, to refresh the memory cells connected to the selected row line.

As long as $\overline{RFSH}$ terminal 3 is kept at the low level, the signal PC holds a high level. Therefore, the power consumption in the input stage of the RAS timing circuit 16 is substantially zero.

When the $\overline{RFSH}$ terminal 3 is inverted from the low to high level to remove the self refresh mode at a time $T_7$, the potential at the node $N_1$ is changed to the low level. Accordingly, the potential at the node $N_2$ is inverted to the high level, so that the transistors $Q_9$ and $Q_6$ are turned on and the transistors $Q_8$ and $Q_7$ are turned off. Consequently, the signal PC is inverted from the high to low level at a time $T_8$. The transistor $Q_{11}$ is then turned on and $Q_{13}$ off. The RAS timing circuit 16 is then ready for introducing the row address strobe signal. That is, the memory is brought into the memory operation. If desired, the internal refresh operation may be performed again.

As described, the memory device according to the present invention reduces the power consumption in the self-refresh mode to save a power at the time of standby. Further, the external control signal (i.e., the row address strobe signal) can take the high or low level, or the terminal may be in a high impedance state. Therefore, the degree of design freedom is increased in the timing circuit for external control signals.

Figure 3:
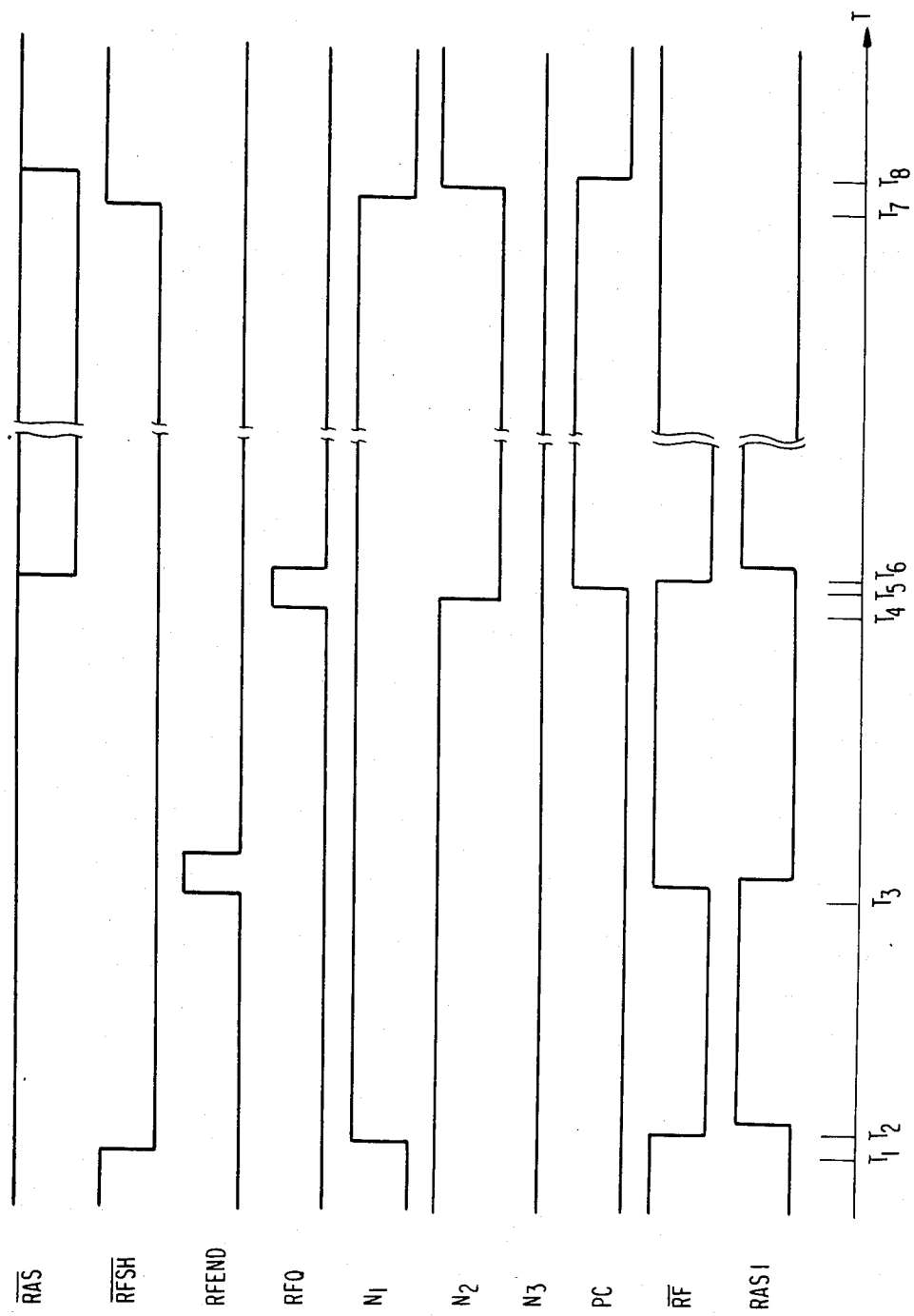
FIG. 3 is a signal waveform diagram of each part of FIG. 3 in a self refresh mode.
Figure 4:
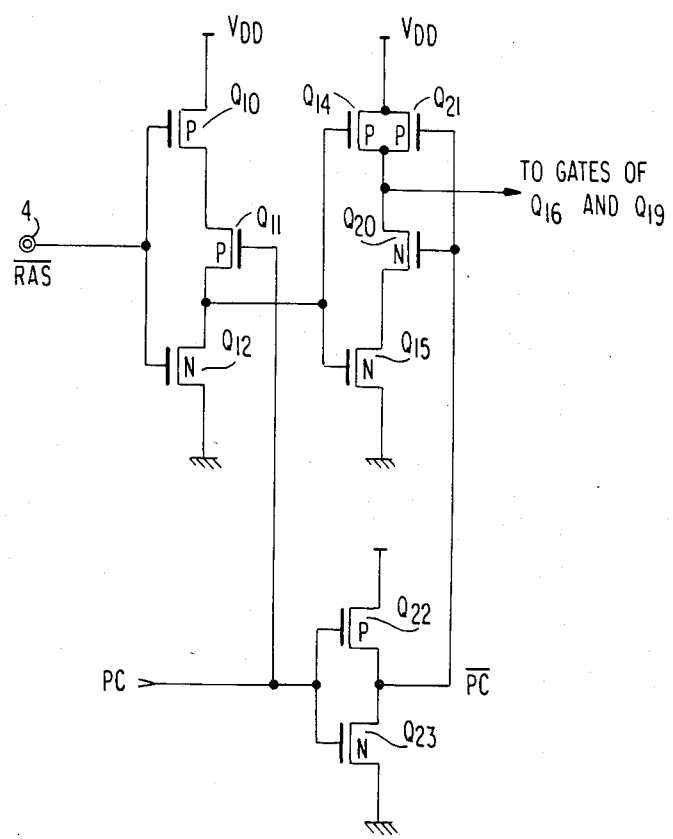
FIG. 4 is another circuit diagram according to the present invention.

FIG. 4 shows another embodiment of the present invention, wherein like reference numerals denote like parts in FIG. 3 to omit the further description thereof. The transistor $Q_{13}$ connected in parallel with the transistor $Q_{12}$ is omitted therein. However, an N-channel MOS transistor $Q_{20}$ is connected between the transistors $Q_{14}$ and $Q_{15}$, and the connection point of the transistors $Q_{14}$ and $Q_{20}$ is connected to the gates of the transistors $Q_{16}$ and $Q_{19}$. A P-channel MOS transistor $Q_{21}$ is connected in parallel with the transistor $Q_{14}$. The transistors $Q_{20}$ and $Q_{21}$ receive at its gate a signal $\overline{PC}$ obtained by inverting the signal PC with a complementary inverter consisting of P- and N-channel MOS transistors $Q_{22}$ and $Q_{23}$.

When the signal PC takes a low level, the transistors $Q_{11}$ and $Q_{20}$ are turned on and $Q_{21}$ off. Accordingly, the transistors $Q_{10}$, $Q_{12}$, $Q_{14}$ and $Q_{15}$ are controlled by the level at $\overline{RAS}$ terminal 4. When the signal PC is inverted to the high level, the transistor $Q_{11}$ is turned off, and thus the d.c. current flowing through the transistors $Q_{10}$ and $Q_{12}$ is cut off. Since the transistor $Q_{20}$ is turned off and $Q_{21}$ on, the potential at the connection point of the transistors $Q_{21}$ and $Q_{20}$ takes a high level, and further a d.c. current flowing through the transistors $Q_{14}$ or $Q_{21}$ and $Q_{15}$ is also cut off.

It is to be understood that the present invention is not limited to the above embodiments, but various changes and modifications may be made in the invention without departing from the spirit and scope thereof. For example, this invention can be applied to the complementary inverter connected to the terminals 5 or 6 in CAS timing circuit 17 and write timing circuit 18. The circuits shown in FIGS. 2 and 4 can be replaced by other transistor circuits having the same function. The present invention can further be applied to a memory device wherein row and column address signals are supplied through independent terminals.

What is claimed is:

1. A memory device comprising a memory cell array having a plurality of memory cells arrayed in a matrix, an internal self-refresh circuit for refreshing at least one of said memory cells, a first terminal receiving a control signal for selectively controlling data write operations and data read operations with respect to a selected memory cell, an input circuit supplied with said control signal through said first terminal and including first and second transistors each having a control electrode connected to said first terminal and coupled in series with each other, a third transistor connected in series with said first and second transistors, means responsive to the commencement of operation of said internal self-refresh circuit for deactivating said third transistor, and means for maintaining the deactivated state of said third transistor over the whole period of operation of said internal self-refresh circuit, whereby said input circuit consumes substantially no power when said internal self-refresh circuit is in operation.

2. The memory device as claimed in claim 1, wherein said first and third transistors are of one conductivity type and said second transistor is of the opposite condictivity type, said third transistor being connected between said first and second transistors.

3. The memory device as claimed in claim 1, further comprising a second terminal receiving a refresh control signal, said internal self-refresh circuit operating in resonse to said refresh control signal and including a timer circuit which produces a refresh request signal for determining a self-refresh cycle, said deactivating means including a means responsive to said refresh control signal and said refresh request signal for producing a power control signal having a level rendering said third transistor non-conductive, and means for supplying a control electrode of said third transistor with said power control signal, said maintaining means including means for holding said power control signal at said level rendering said third transistor non-conductive.

4. A memory device comprising a memory cell array having a plurality of row and column lines and a plurality of memory cells disposed at the intersections of said row and column lines, at least one address input means responsive to an address-enable signal for latching the address signal supplied to said address input terminal, a row decoder responsive to the output of said address input means for selecting one of said row lines, means responsive to an external control signal for producing said address-enable signal, said producing means including a first field effect transistor receiving at its gate said external control signal, an internal refresh circuit operable in a self-refresh mode to supply an internal address signal to said row decoder, said row decoder being responsive to said internal address signal for selecting one of said row lines to refresh the memory cells connected to the selected row line, and means responsive to the operation in said self-refresh mode of said internal refresh circuit for preventing a d.c. current from flowing through said first field effect transistor over the whole period of said self-refresh mode.

5. The memory device as claimed in claim 4, wherein said preventing means includes a second field effect transistor connected in series with said first field effect transistor and having a gate supplied with a power control signal having one logic level that makes said second field effect transistor nonconductive in said self-refresh mode.

6. The memory device as claimed in claim 5, wherein said power control signal is generated from said internal refresh circuit and holding said one logic level during said self-refresh mode, and said internal refresh circuit changes said power control signal from said one logic level to the other logic level that makes said second field effect transistor conductive when said self-refresh mode ends.

7. A memory device comprising a row address strobe terminal supplied with a row address strobe signal, a row address strobe timing circuit connected to said row address strobe terminal and responsive to said row address strobe signal to produce a plurality of internal control signals, said row address strobe timing circuit including a transistor having a gate connected to said row address strobe terminal to receive said row address strobe signal, a plurality of address input terminals supplied with address signals, a refresh terminal supplied with a refresh control signal, a refresh timing circuit activated by said refresh control signal to perform an internal refresh operation, a timer circuit controlled by said refresh timing circuit to generate a refresh request signal in a predetermined cycle, an internal address counter controlled by said refresh timing circuit to change the content thereof, said refresh timing circuit producing an internal refresh control signal in response to said refresh request signal, an address multiplexer coupled to said address input terminals and said internal address counter and outputting the address signals supplied to said address input terminals as a row address when said row address strobe timing circuit produces said internal control signals and the content of said internal address counter as a row address when sid refresh timing circuit produces said internal refresh control signal, said refresh timing circuit further producing a power control signal in response to said refresh request signal, and power saving circuit means responsive to said power control signal for disconnecting a source-drain current path of said transistor from a power terminal until the end of said refresh control signal, to prevent a d.c. current from flowing into said transistor.

8. A memory device comprising a first terminal supplied with an external control signal, an input circuit connected to said first terminal to output an inverted signal of said external control signal and including a first field effect transistor of one conductivity type, a second field effect transistor of said one conductivity type and a third field effect transistor of the opposite conductivity type connected in series between first and second power supply terminals, the gates of said first and third transistors being connected in common to said first terminal, a first signal generating generating at least one internal control signal for controlling an addressing operation in response to the output of said input circuit, a second terminal supplied with a refresh control signal, a second signal generator generating at least one internal refresh control signal for performing an internal self-refresh operation in response to said refresh control signal, means for producing a power control signal representing that said internal self-refresh operation is performed, and means responsive to said power control signal for rendering said second transistor non-conductive over the entire period of said internal self-refresh operation, whereby a d.c. current is prevented from flowing through said first and third transistors.

9. The memory device as claimed in claim 8, wherein said input circuit further includes a fourth field effect transistor of said opposite conductivity type connected in parallel with said third transistor and having a gate supplied with said power control signal, said fourth transistor being made conductive when said second transistor is made nonconductive.

10. The memory device as claimed in claim 8, wherein said first signal generator has a fourth transistor of said one conductivity type, a fifth transistor of said one conductivity type, a sixth transistor of said opposite conductivity type and a seventh transistor of said opposite conductivity type, said fourth, sixth and seventh transistors being connected in series between said first and second power supply terminals, said fifth transistor being connected in parallel with said fourth transistor, the gates of said fourth and seventh transistors being supplied with the output of said input circuit, and the gates of said fifth and sixth transistors being supplied with an inverted signal of said power control signal.

11. A semiconductor memory comprising a plurality of memory cells, a plurality of address terminals supplied with address signals, a first terminal supplied with a row address strobe signal, a row address strobe timing circuit coupled to said first terminal and producing a set of first internal control signals when said row address strobe signal is supplied, means responsive to said first internal control signals and said address signals for selecting at least one memory cell, said row address strobe timing circuit including a first transistor of one conductivity type, a second transistor of said one conductivity type and a third transistor of an opposite conductivity type connected in series between power supply terminals, said first and third transistors havng gates connected to said first terminal, a second terminal supplied with a refresh control signal, a timer circuit activated by said refresh control signal and producing a refresh request signal in a predetermined cycled period, a refresh timing circuit producing a set of second internal control signals in response to at least one of said refresh control signal and said refresh request signal, an internal address counter, means responsive to said second internal control signals for selecting at least one memory cell corresponding to a content of said internal address counter, means responsive to said refresh control signal and said refresh request signal for producing a power control signal having a first level which renders said seocnd transistor nonconductive, means for latching said power control signal, means for supplying the latched power control signal to said second transistor, and means for resetting said latching means to change said power control signal from said first level to a second level which renders said second transistor conductive when said refresh control signal is ended, whereby a d.c. current is prevented from flowing through said first and third transistors until the end of said refresh control signal.

12. The memory circuit as claimed in claim 11, wherein said row address strobe timing circuit further includes a fourth transistor of said opposite conductivity type connected in parallel with said third transistor and supplied with said power control signal.

13. A semiconductor memory comprising a row address strobe terminal supplied with a row address strobe signal, first and second power supply terminals, a first circuit node, a first transistor of one conductivity type having a gate connected to said row address strobe terminal, a second transistor of said one conductivity type connected in series with said first transistor between said first power supply terminal and said first node, a third transistor of an opposite conductivity type having a gate connected to said row address strobe terminal, said third transistor being connected between said first node and said second power supply terminal, a plurality of memory cells, means for selecting one of said memory cells responsive to external address signals when a signal at said first node assumes an activating level, a refresh control terminal supplied with a refresh control signal, a second circuit node, a fourth transistor of said one conductivity type connected between said first power supply terminal and said second circuit node, a fifth transistor of opposite conductivity type, means for connecting said refresh control terminal to gates of said fourth and fifth transistors, a sixth transistor of said opposite conductivity type connected in series with said fifth transistor between said second circuit node and said second power supply terminal, a latch circuit latching a level at said second circuit mode, means for supplying an output of said latch circuit to a gate of said second transistor, a timer circuit operating when said refresh control signal assumes an activating level and producing a refresh request signal, means for supplying said refresh request signal to a gate of said sixth transistor, an internal address counter, and means responsive to said refresh request signal for selecting one of said memory cells reponsive to a content of said internal address counter, whereby said latch circuit turns off said second transistor to prevent a d.c. current from flowing through said first and second transistors during the period of time when said timer circuit is operational.

14. The memory circuit as claimed in claim 13, wherein said latch circuit includes a seventh transistor of said one conductivity type, an eight transistor of said opposite conductivity type connected in series between said first and second power supply terminals, means for connecting said second circuit node to gates of said seventh and eighth transistors, a ninth transistor of said one conductivity type, a tenth transistor of said opposite conductivity type connected in series between said first power supply terminal and a connection point of said fifth and sixth transistors, means for connecting said second node to a connection point of said ninth and tenth transistors, means for connecting a connection point of said seventh and eight transistors to gates of said ninth and tenth transistors, and means for connecting the connection point of said seventh and eighth transistors to the gate of said second transistor.

* * * * *

UNITED STATES PATENT AND TRADEMARK OFFICE
CERTIFICATE OF CORRECTION

PATENT NO. : 4,688,196
DATED : August 18, 1987
INVENTOR(S) : Yasaburo Inagaki et al Page 1 of 2

It is certified that error appears in the above-identified patent and that said Letters Patent is hereby corrected as shown below:

Abstract, line 8, after "circuit" delete ",".

Column 1, line 37, after "RAS" delete " " "

Column 5, line 31, delete RF insert -- $\overline{RF}$ --

Column 7, line 51, delete RF insert -- $\overline{RF}$ --.

Column 6, line 40, delete "preform" insert --perform--

Column 8, line 57, delete "throught" insert --through--

Column 11, line 47, delete "sid" insert --said--

Column 11, line 54, after "power" insert --source--

Column 12, line 60, delete "seocnd" insert --second--

UNITED STATES PATENT AND TRADEMARK OFFICE
CERTIFICATE OF CORRECTION

PATENT NO. : 4,688,196
DATED : August 18, 1987
INVENTOR(S) : Yasaburo Inagaki et al It is certified that error appears in the above-identified patent and that said Letters Patent is hereby corrected as shown below:

Column 14, line 1, delete "mode" insert -- node --.

Signed and Sealed this

Thirtieth Day of August, 1988

Attest:

DONALD J. QUIGG

*Attesting Officer*   *Commissioner of Patents and Trademarks*